(12) United States Patent
Kang et al.

(10) Patent No.: US 7,909,480 B2
(45) Date of Patent: Mar. 22, 2011

(54) LIGHT SOURCE MODULE, METHOD OF FABRICATING THE SAME, AND DISPLAY DEVICE HAVING THE LIGHT SOURCE MODULE

(75) Inventors: Eun-Jeong Kang, Cheonan-si (KR);
Seok-Won Kang, Gwangju-si (KR);
Young-Keun Lee, Cheonan-si (KR);
Ho-Sik Shin, Anyang-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/193,470

(22) Filed: Aug. 18, 2008

(65) Prior Publication Data
US 2009/0185393 A1 Jul. 23, 2009

(30) Foreign Application Priority Data

Jan. 17, 2008 (KR) .................. 10-2008-0005361

(51) Int. Cl.
*F21V 33/00* (2006.01)
(52) U.S. Cl. .................. 362/249.02; 362/612; 362/800
(58) Field of Classification Search .................. 362/612, 362/613, 800, 545, 249.02, 249.04
See application file for complete search history.

(56) References Cited

U.S. PATENT DOCUMENTS

| | | | | |
|---|---|---|---|---|
| 4,667,270 A | * | 5/1987 | Yagi | 361/820 |
| 6,946,601 B1 | * | 9/2005 | Lee et al. | 174/534 |
| 2005/0275748 A1 | * | 12/2005 | Takekuma et al. | 348/370 |
| 2008/0030645 A1 | * | 2/2008 | Nam et al. | 349/61 |

FOREIGN PATENT DOCUMENTS

| | | |
|---|---|---|
| JP | 07-297516 | 11/1995 |
| KR | 100668648 | 1/2007 |
| KR | 1020070014692 | 2/2007 |
| KR | 1020070063978 | 6/2007 |

* cited by examiner

*Primary Examiner* — Laura Tso
(74) *Attorney, Agent, or Firm* — F. Chau & Associates, LLC (57) ABSTRACT

A light source module includes a mounting substrate including at least two exposed metal lines, a light-emitting diode (LED) including two electrodes disposed corresponding to the at least two exposed metal lines, and an anisotropic conductive film (ACF) provided on the mounting substrate, the ACF electrically connecting the at least two exposed metal lines to the two electrodes, wherein the ACF comprises an insulation body, and a plurality of conductive particles dispersed in the insulation body and insulated from each other, and an insulation of the conductive particles disposed between the two exposed metal lines and the two electrodes of the LED is prevented in at least a first direction.

20 Claims, 5 Drawing Sheets

LIGHT SOURCE MODULE, METHOD OF FABRICATING THE SAME, AND DISPLAY DEVICE HAVING THE LIGHT SOURCE MODULE

CROSS-REFERENCE TO RELATED APPLICATION

This application claims priority to Korean Patent Application No. 10-2008-0005361 filed on Jan. 17, 2008, the contents of which are incorporated by reference herein in their entirety.

TECHNICAL FIELD

The present disclosure relates to a light source module, a method of fabricating the same and a display device having the light source module, and more particularly, to a light source module preventing optical property changes of a light-emitting diode (LED) used as a light source of the light source module by protecting the LED from thermal shock, and a display device having the light source module.

DISCUSSION OF RELATED ART

A liquid crystal display (LCD) is a passive device that cannot emit light by itself. The LCD displays an image using light provided from a separate light source module, e.g., a backlight unit. A light-emitting diode (LED) is used as a light source of the light module. The LED has characteristics such as, for example, long lifetime, low power consumption, light weight and a slim profile. The LED is a point light source. A line light source or a surface light source is fabricated using a plurality of the point light sources, e.g., LEDs.

When using a plurality of LEDs as a light source, optical properties such as color coordinates or luminosity of the respective LEDs need to be equalized. If the optical properties of the respective LEDs are not equalized, a dispersion of the luminosity or color coordinates becomes large such that a color difference occurs in a pixel of a display panel. Therefore, a plurality of LEDs, of which optical properties are equalized within an error range, may be used to avoid the color difference. However, luminosity and color coordinates of the LED are substantially changed by heat. Therefore, although a light source is fabricated using a plurality of LEDs of which optical properties are equalized within an error range, the luminosity and color coordinates of the LED can be substantially changed by heat generated during a fabrication process.

SUMMARY OF THE INVENTION

Exemplary embodiments of the present invention provide a light source module for a display device, which can prevent optical properties of a light-emitting diode (LED) from being changed by heat generated during a mounting process of the LED, and a display device having the light source module.

According to an exemplary embodiment of the present invention, a light source module includes a mounting substrate including at least two exposed metal lines, a light-emitting diode (LED) including two electrodes disposed corresponding to the at least two exposed metal lines, and an anisotropic conductive film (ACF) provided on the mounting substrate, the ACF electrically connecting the at least two exposed metal lines to the two electrodes, wherein the ACF comprises an insulation body, and a plurality of conductive particles dispersed in the insulation body and insulated from each other, and an insulation of the conductive particles disposed between the two exposed metal lines and the two electrodes of the LED is prevented in at least a first direction.

The first direction can be perpendicular to a surface of the mounting substrate.

A release film can be attached on a first region of the ACF excluding a second region where the LED is positioned.

The mounting substrate may comprise at least one of a printed circuit board (PCB) or a flexible PCB.

The insulation body may comprise a thermoplastic adhesive.

The conductive particle may comprise at least one of a metal particle or a resin particle coated with a metal, and an insulation layer is provided on a surface of the conductive particle.

According to an exemplary embodiment of the present invention, a method of fabricating a light source module, the method comprising attaching a first side of an anisotropic conductive film (ACF) on a mounting substrate, the mounting substrate including at least two exposed metal lines, disposing a light-emitting diode (LED) on a second side of the ACF such that two electrodes of the LED correspond to the at least two exposed metal lines, heating the ACF on the mounting substrate, and pressing the LED and a first portion of the mounting substrate, the first portion of the mounting substrate corresponding to the LED.

Pressing the LED and the first portion of the mounting substrate can be performed while heating the ACF.

The method may further comprise forming a release film on the second side of the ACF before attaching the first side of the ACF on the mounting substrate, and removing the release film from a region where the LED is to be formed after attaching the first side of the ACF on the mounting substrate.

Heating the ACF can be performed at a temperature ranging from approximately 70° C. to approximately 150° C.

According to an exemplary embodiment of the present invention, a light source module includes a flexible printed circuit board (PCB) including at least two exposed metal lines, a plurality of sockets electrically connected to the at least two exposed metal lines, and a light-emitting diode (LED) including two electrodes coupled to the plurality of sockets.

The plurality of sockets can be electrically connected to the at least two exposed metal lines through at least one of a solder, a conductive adhesive or an anisotropic conductive film (ACF).

The light source module may further comprise a heat sink member provided between the flexible PCB and the LED.

The heat sink member may comprise at least one of a heat slug, heat sink grease or heat sink tape.

According to an exemplary embodiment of the present invention, a display device comprise a light source module comprising a mounting substrate including at least two exposed metal lines, a light-emitting diode (LED) including two electrodes disposed corresponding to the at least two exposed metal lines, and an anisotropic conductive film (ACF) provided on the mounting substrate, wherein the ACF electrically connects the at least two exposed metal lines to the two electrodes and a display panel displaying an image using light provided from the light source module.

The light source module may comprise a plurality of LEDs and a light guide plate disposed adjacent to the plurality of LEDs.

The light source module may comprise a plurality of mounting substrates where the plurality of LEDs are electrically connected to the at least two exposed metal lines through the ACF, and the plurality of mounting substrates are uniformly disposed under the display panel.

According to an exemplary embodiment of the present invention, a display device comprises a light source module comprising a flexible printed circuit board (PCB) including at least two exposed metal lines, a plurality of sockets electrically connected to the at least two exposed metal lines, and a light-emitting diode (LED) including two electrodes coupled to the plurality of sockets, and a display panel displaying an image using light provided from the light source module.

BRIEF DESCRIPTION OF THE DRAWINGS

Exemplary embodiments of the present invention can be understood in more detail from the following description taken in conjunction with the accompanying drawings, in which.

DETAILED DESCRIPTION OF EXEMPLARY EMBODIMENTS

Hereinafter, embodiments will be described in detail with reference to the accompanying drawings. The present invention may, however, be embodied in different forms and should not be construed as limited to the embodiments set forth herein.

It will also be understood that when a layer, a film, a region or a plate is referred to as being 'on' another one, it can be directly on the other one, or one or more intervening layers, films, regions or plates may also be present. It will be understood that when a layer, a film, a region or a plate is referred to as being 'under' another one, it can be directly under the other one, and one or more intervening layers, films, regions or plates may also be present. It will be understood that when a layer, a film, a region or a plate is referred to as being 'between' two layers, films, regions or plates, it can be the only layer, film, region or plate between the two layers, films, regions or plates, or one or more intervening layers, films, regions or plates may also be present.

Figure 1:
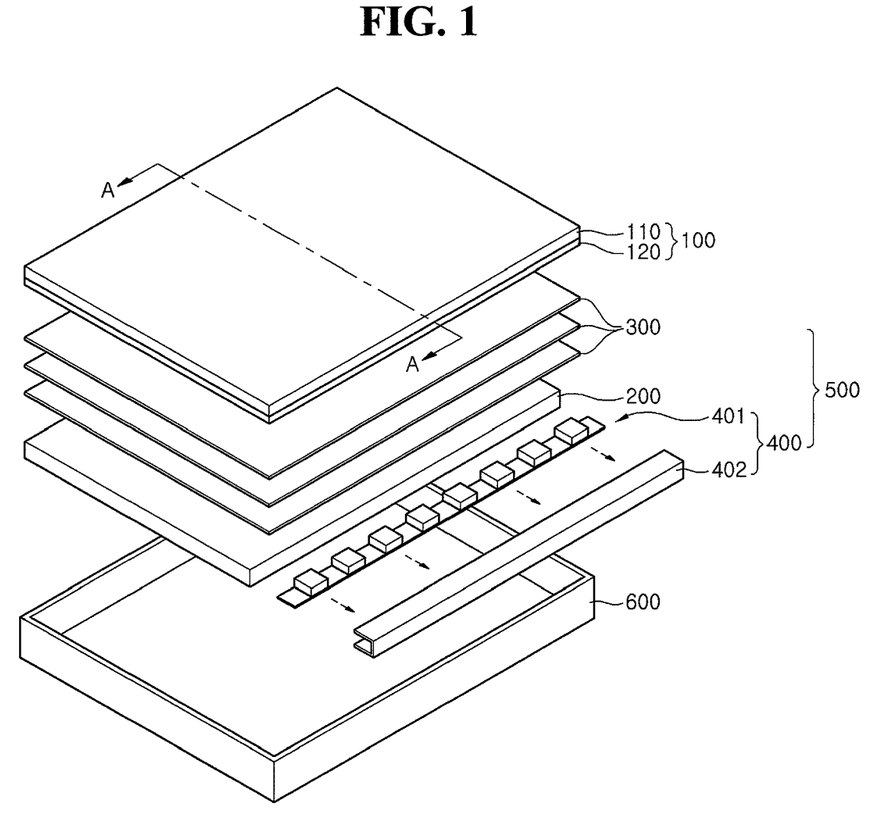
FIG. 1 is an exploded perspective view of a display device in accordance with an exemplary embodiment of the present invention.
Figure 2:
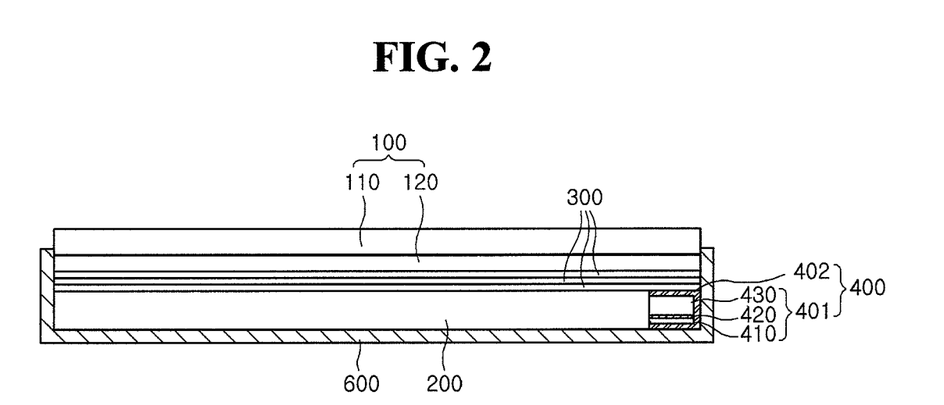
FIG. 2 is a cross-sectional view of an assembled display device, taken along the line A-A of FIG. 1.
Figure 3:
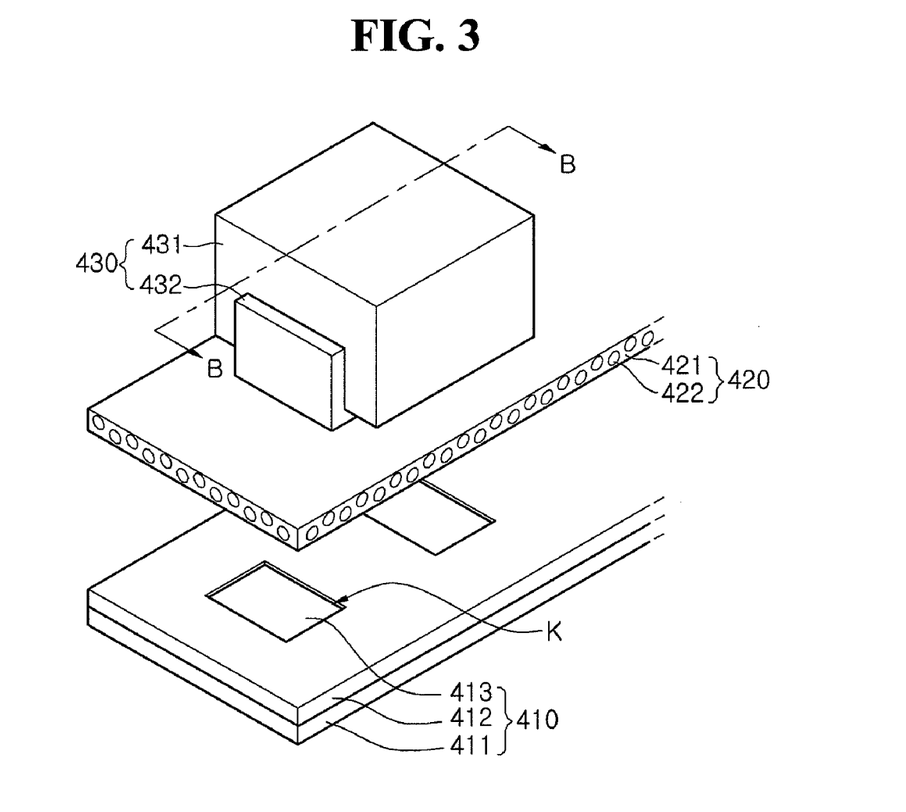
FIG. 3 is an exploded perspective view of a light source according to an exemplary embodiment of the present invention.
Figure 4:
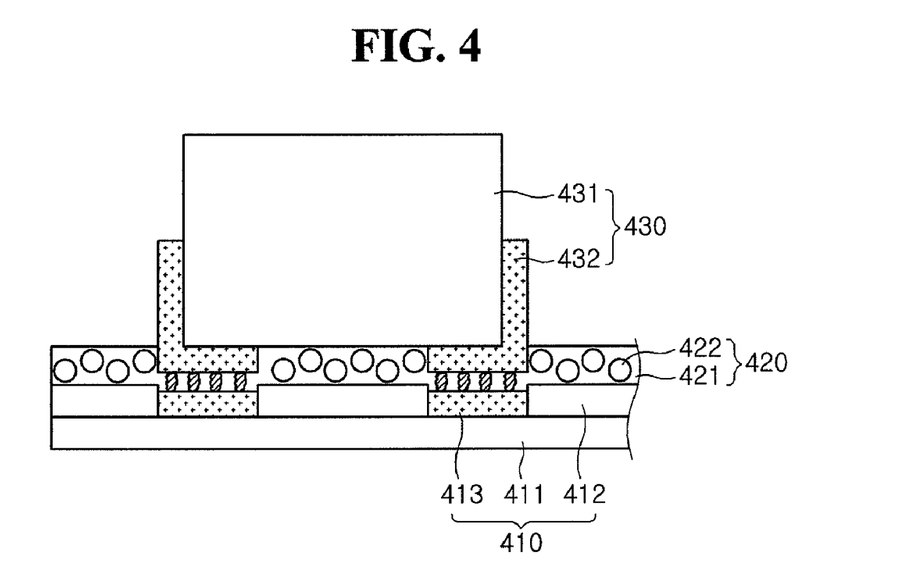
FIG. 4 is a cross-sectional view of an assembled light source, taken along the line B-B of FIG. 3.
Figure 5:
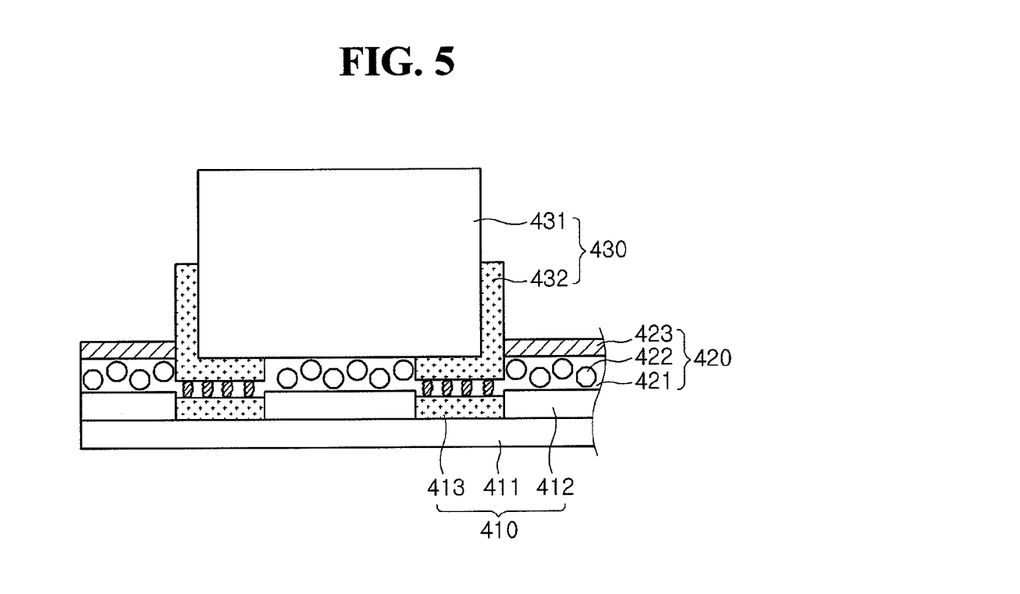
FIG. 5 is a cross-sectional view of a light source in accordance with an exemplary embodiment of the present invention.

FIG. 1 is an exploded perspective view of a display device in accordance with an exemplary embodiment of the present invention. FIG. 2 is a cross-sectional view of an assembled display device, taken along the line A-A of FIG. 1. FIG. 3 is an exploded perspective view of a light source according to an exemplary embodiment of the present invention. FIG. 4 is a cross-sectional view of an assembled light source, taken along the line B-B of FIG. 3. FIG. 5 is a cross-sectional view of a light source in accordance with an exemplary embodiment of the present invention.

Referring to FIGS. 1 through 4, a display device includes a display panel 100 configured to display an image, a light source module 500 configured to provide light to the display panel 100, a receiving member 600 configured to receive the display panel 100 and the light source module 500.

The display panel 100 includes an upper substrate 110, a lower substrate 120, and a liquid crystal (not shown) provided therebetween.

A light blocking pattern and R, G, B color filters are disposed on the upper substrate 110. The R, G, B color filters realize predetermined colors when light passes therethrough. A common electrode is disposed on the light blocking pattern and the color filter. In an exemplary embodiment, the common electrode is formed of a transparent conductor, for example, indium tin oxide (ITO) or indium zinc oxide (IZO). In an exemplary embodiment, the light blocking pattern and the color filter may be provided on the lower substrate 120.

The lower substrate 120 includes a plurality of pixel electrodes and a plurality of TFTs, arranged in a matrix form. Each of the TFTs can be connected to the corresponding pixel electrode. The TFT includes a source terminal connected to a data line, a gate terminal connected to a gate line, and a drain terminal connected to the pixel electrode. The pixel electrode of the lower substrate 120 and the common electrode of the upper substrate 110 are separated from and face each other. Thus, the pixel electrode and the common electrode serve as two electrodes of a capacitor, and the liquid crystal between the upper and lower substrates 110 and 120 serves as a dielectric of the capacitor.

When a gate turn-on voltage is applied to a gate line, the TFTs connected to the gate line are turned on. When an image signal is applied through the data line, the image signal is provided to the pixel electrode via the source and drain terminals of the TFT turned on, which changes an electric field between the pixel electrode of the lower substrate 120 and the common electrode of the upper substrate 110. This is because a potential of the pixel electrode is changed to a level corresponding to the image signal. Such a change in electric field changes an orientation of the liquid crystal between the pixel electrode and the common electrode. The light transmittance of the liquid crystal differs according to the orientation of the liquid crystal. The display panel 100 can display a desired image by changing the light transmittance of the liquid crystal.

The display panel 100 includes a driving circuit configured to apply predetermined signals to the gate and data lines of the lower substrate 120, and the common electrode of the upper substrate 110, respectively. The driving circuit includes a gate driver configured to apply the gate turn-on voltage to the gate line, a data driver configured to apply a data signal to the data line, and a voltage generator configured to generate voltages used in the driving circuit. The driving circuit may include an operation controller configured to control the gate driver and the voltage generator. The driving circuit may include a clock generator configured to generate clocks. The driving circuit is mounted on a printed circuit board (PCB) electrically connected to the lower substrate 120 or the upper substrate 110 through, for example, a flexible PCB. In an exemplary embodiment, some elements of the driving circuit may be mounted on the lower substrate 120. In an exemplary embodiment, the gate driver may be formed on the lower substrate 120.

The light source module 500 in accordance with an exemplary embodiment includes a light guide plate 200, an optical film unit 300 disposed over the light guide plate 200, and a light source unit 400 adjacently disposed at one side of the light guide plate 200.

The light guide plate 200 has a rectangular plate shape, and changes optical distribution from point light or line light to surface light. The light guide plate 200 may be formed of, for example, polymethylmethacrylate (PMMA) because the PMMA has excellent light transmittance and strength. An optical pattern such as a prism pattern may be provided on a surface of the light guide plate 200. In an exemplary embodiment, a reflection plate may be disposed under the light guide plate 200. The reflection plate reflects light, which is downwardly emitted below the light guide plate 200, toward the display panel 100, i.e., in an upward direction of the light guide plate 200.

The optical film unit 300 includes at least one brightness enhancement sheet and at least one diffusion sheet. The brightness enhancement sheet transmits light propagating in a direction parallel with its transmission axis but reflects light propagating in other directions. The diffusion sheet allows the light provided from the light guide plate 200 to diffuse to have uniform distribution over a wide range. The optical film unit 300 may include a diffusion plate having a same function as the diffusion sheet. The optical film unit 300 may include various optical sheets or optical plates changing optical properties of the light.

The light source unit 400 includes a light source 401 and a light source cover 402.

Referring to FIGS. 3 and 4, the light source 401 includes a mounting substrate 410, a plurality of LEDs 430, and an anisotropic conductive film (ACF) 420. The ACF 420 fixes the LED 430 to the mounting substrate 410, and electrically connects the plurality of LEDs 430 to the mounting substrate 410.

In an exemplary embodiment, the mounting substrate 410 may employ a flexible printed circuit board (PCB), thus realizing the small-sized and lightweight light source unit 400. However, the mounting substrate 410 is not limited to the flexible PCB, and thus the mounting substrate 410 may employ various insulation substrates on which conductive line patterns are formed. For example, a PCB may be used as the mounting substrate 410.

The mounting substrate 410 includes a base film 411, a plurality of metal lines 413 disposed on the base film 411, and a protection film 412 configured to protect the metal lines 413. In an exemplary embodiment, the base film 411 can be easily bent.

A portion of the protection film 412 is removed to expose a predetermined portion of the metal line 413 (e.g., the region K of FIG. 3). The predetermined portion of the metal line 413 exposed by partially removing the protection film 412 is referred to as a line mounting part K or an exposed metal line 413. The LED 430 is mounted on the line mounting part K or the exposed metal line 413. One LED 430 is mounted on a pair of the line mounting parts. That is, a first electrode of the LED 430 is mounted on a first line mounting part, and a second electrode of the LED 430 is mounted on a second line mounting part. Although FIG. 3 illustrates that a pair of the line mounting parts are disposed above and below the mounting substrate 410 vertically, a pair of the line mounting parts may be disposed at the left and the right side of the mounting substrate 410 horizontally. In an exemplary embodiment, the arrangement of the line mounting part K may be variously changed depending on patterns of the metal lines 413 disposed on the base film 411.

In an exemplary embodiment, a portion of the mounting substrate 410 may extend to be connected to an external power supply. That is, the metal line 413 of the mounting substrate 410 is connected to the power supply to receive an external power. The power supply may be provided outside the receiving member 600 receiving the light source module 500.

Each of the plurality of LEDs 430 includes a body 431 receiving a light-emitting element, and an electrode 432 electrically connected to the light-emitting element and protruding outwardly from the body 431.

The body 431 may be formed in a substantially hexagonal shape. In an exemplary embodiment, the shape of the body 431 may be variously modified. In an exemplary embodiment, the LED 430 emits light in a parallel direction with respect to a mounting surface of the mounting substrate 410. In an exemplary embodiment, the LED 430 may emit light in a perpendicular direction with respect to the mounting surface of the mounting substrate 410. The electrode 432 includes a first electrode connected to an anode terminal of the light-emitting element, and a second electrode connected to a cathode terminal of the light-emitting element. The electrode 432 is exposed at outer sides of the body 431 and a portion of the electrode 432 extends to a base of the body 431. The base of the body 431 can be a portion under the body 431 in FIG. 4. In an exemplary embodiment, the electrode 432 may be exposed at the base of the body 431.

In an exemplary embodiment, the electrode 432 extending under the body 431 is electrically connected to the exposed metal line 413 of the mounting substrate 410 through the ACF 420.

The ACF 420 includes an insulation body 421, and a plurality of conductive particles 422 provided in the insulation body 421.

A thermoplastic adhesive may be used as the insulation body 421. For example, an epoxy resin or an acryl resin may be used as the insulation body 421. In an exemplary embodiment, the insulation body 421 employs a thermoplastic adhesive. When using the adhesive property of the ACF 420, the LED 430 can be fixed to the mounting substrate 410. The plurality of conductive particles 422 can be uniformly dispersed in the insulation body 421. The adjacent conductive particles 422 are insulated from each other. A particle diameter of the conductive particle 422 may be in the range of approximately 2 μm to approximately 10 μm. The conductive particle 422 may include a metal particle or a resin particle coated with a metal. To insulate the adjacent conductive particles 422 from each other, the surface of the conductive particle 422 may be covered with an insulating resin film.

In an exemplary embodiment, the conductive particles 422 in the insulation body 421 are insulated from one another in all directions, that is, in width, length and thickness directions of the ACF 420. If a pressure is applied in the thickness direction of the insulation body 421, the conductive particles 422, in a region of the ACF 420 where the pressure is applied, are broken or pressed down. As a result, the insulation of the conductive particle 422 is reduced or prevented in the thickness direction of the ACF 420. As a result, the conductive film 420 is electrically conductive in the thickness direction due to the broken or pressed conductive particles 422 in the region where the pressure is applied. The insulation state is still maintained in a region of the ACF 420 where the pressure is not applied.

In an exemplary embodiment, the ACF 420 is disposed between the LED 430 and the mounting substrate 410. The insulating property of the conductive particle 422 between the electrode 432 of the LED 430 and the exposed metal line 413 of the mounting substrate 410 is terminated, whereas the conductive particles in other regions are still electrically insulated. Thus, the electrode 432 of the LED 430 and the metal line 413 of the mounting substrate 410 are electrically conductive.

Referring to FIG. 5, the ACF 420 includes a release film 423 provided on the insulation body 421 having adhesive property. The release film 423 is used to attach the ACF 420 onto the mounting substrate 410, and the release film 423 is removed after the ACF 420 is completely attached onto the mounting substrate 410. In an exemplary embodiment, the release film 423 is not removed except for at a contact region with the LED 430. That is, the ACF 420 may include the release film 423 on the insulation body 421 and the release film 423 has an open portion corresponding to the LED 430. The release film 423 may prevent foreign substances from being caught in a region where the LED 430 is not disposed.

Referring to FIG. 5, one side of the ACF 420 is attached to the mounting substrate 410 having the exposed metal line 413. To attach the ACF 420 to the mounting substrate 410, the release film 423 may be attached to the other side of the ACF 420. Thereafter, the release film 423 on the other side of the ACF 420 is removed. Subsequently, the LED 430 is disposed on the other side of the ACF 420 such that the electrode 432 of the LED 430 is positioned over the exposed metal line 413 of the mounting substrate 410. At this time, the release film 423 may not be completely removed but only a portion of the release film in the region where the LED 430 is mounted may be removed. As such, only a portion of the insulation body 421 of the ACF 420 can be exposed.

The LED 430 may be then disposed on the exposed insulation body 421. Afterwards, the LED 430 and the mounting substrate 410 are pressed while heating the ACF 420 at a temperature ranging from approximately 70° C. to approximately 150° C. When the heating temperature is lower than the above-described range, the ACF 420 exhibits poor adhesive properties. When the heating temperature is higher than the above-described range, the LED 430 is damaged by heat. At this time, since a pressure is not applied to the region of the ACF 420 where the LED 430 is not disposed, the conductive particles in this region of the ACF 420 are not affected by the pressure. Therefore, the conductive particles in the region where the LED 430 is not disposed maintain their insulation state. When the LED 430 and the mounting substrate 410 are pressed, the pressure is concentrated on the electrode 432 of the LED 430, causing the conductive particles 422 in the ACF 420 disposed under the electrode 432 to be pressed down or broken. Accordingly, the electrode 432 of the LED 430 and the exposed metal line 413 of the mounting substrate 410, which are respectively placed over and under the ACF 420, can be electrically connected to each other. Although the pressure is also transferred up to a region between the base of the body 431 of the LED 430 and the mounting substrate 410, this region still maintains a constant gap because of the electrode 432 formed on the base of the body 431. Consequently, the conductive particles 422 in this region are not pressed down or broken, thus maintaining insulation properties. That is, the region between the first and second electrodes of the LED 430 is electrically insulated.

In an exemplary embodiment, by using a conductive ACF containing the conductive particles 422, the LED 430 can be fixed to the mounting substrate 410, and the LED 430 can be electrically connected to the mounting substrate 410. As such, an additional process of fixing the LED 430 to the mounting substrate 410 can be omitted. If the electrode 432 of the LED 430 is electrically connected to the metal line 413 of the mounting substrate 410 through a surface mount technology (SMT), the optical properties of the LED 430 can be changed due to heat because the SMT is performed at about 250° C. In an exemplary embodiment, the electrode 432 of the LED 430 can be electrically connected to the metal line 413 of the mounting substrate 410 at a low temperature of approximately 150° C. using the ACF 420 containing the conductive particles 422. Accordingly, the optical properties of the LED 430 can be prevented from being changed by the heat generated during a mounting process.

Although FIG. 1 illustrates that eight LEDs 430 are mounted on the mounting substrate 410, the embodiments of present invention are not limited thereto. That is, number of the LEDs 430 to be mounted on the mounting substrate 410 may be changed depending on, for example, the size of the light guide plate 200, the output brightness of the LED 430, and the target brightness of the display device. A mounting space of the LED may be changed. The plurality of LEDs 430 mounted on the mounting substrate 410 may be connected in series, in parallel or in anti-parallel using the metal line 413 of the mounting substrate 410, electrically connected through the ACF.

In an exemplary embodiment, the LED 430 may emit white light. In an exemplary embodiment, red, green and blue light-emitting elements may be provided in the body 431 of the LED 430. In an exemplary embodiment, the body 431 of the LED 430 may include a blue light-emitting element and a yellow phosphor provided in the periphery of the blue light-emitting element.

Referring to FIGS. 1 and 2, the light source 401 can be fixedly inserted into the light source cover 402. The light source cover 402 may be formed in a hexagonal prism with one side open. The light source cover 402 may have a reflection layer on inner walls thereof to reflect light toward the open side. The light source 401 in an exemplary embodiment may be flexible. For example, the light source 401 can be formed on the flexible PCB. The light source 401 is fixed by the light source cover 402. In an exemplary embodiment, a height of the open side of the light source cover 402 may be equal to a total height of the light source 401. In an exemplary embodiment, the light source 401 may be fixed to the light source cover 402 using an additional fixing member such as an adhesive. In an exemplary embodiment, the light source 401 may be disposed on the receiving member 600 and fixed to the light source cover 402.

The light source module 500 in an exemplary embodiment is assembled inside the receiving member 600. For example, the light guide plate 200 is disposed on a bottom surface of the receiving member 600, and the light source unit 400 is disposed in an inner space between one side of the light guide plate 200 and a side surface of the receiving member 600. This structure allows light generated from the light source 401 of the light source unit 400 to be provided to one side of the light guide plate 200. The optical film unit 300 is disposed over the light guide plate 200. Thereafter, the display panel 100 is disposed over the light source module 500.

Although this exemplary embodiment illustrates that an edge type light source module is used as the light source module 500, the embodiments of the present invention are not limited thereto. For example, a direct type light source module using the light source 401 may be used as the light source module 500. That is, the light guide plate 200 is not used but the plurality of light sources 401 are disposed on the bottom surface of the receiving member 600 at regular intervals. For example, the direct type light source module includes a plurality of mounting substrates disposed at regular intervals, where the plurality of LEDs are electrically connected to a pair of the metal lines 413 through the ACF 420. The direct type light source module may include a mold frame configured to fix the plurality of light sources 401 and support the optical film unit 300. The direct type light source module may include a heat blocking layer for preventing heat from being transferred to the display panel 100 because the plurality of light sources 401 are used.

In an exemplary embodiment, the light source 401 of the light source module 500 may be implemented such that the LED 430 is mounted on the mounting substrate 410 using a socket. This can prevent the LED from being damaged by heat generated during the fabrication of the light source.

Figure 6:
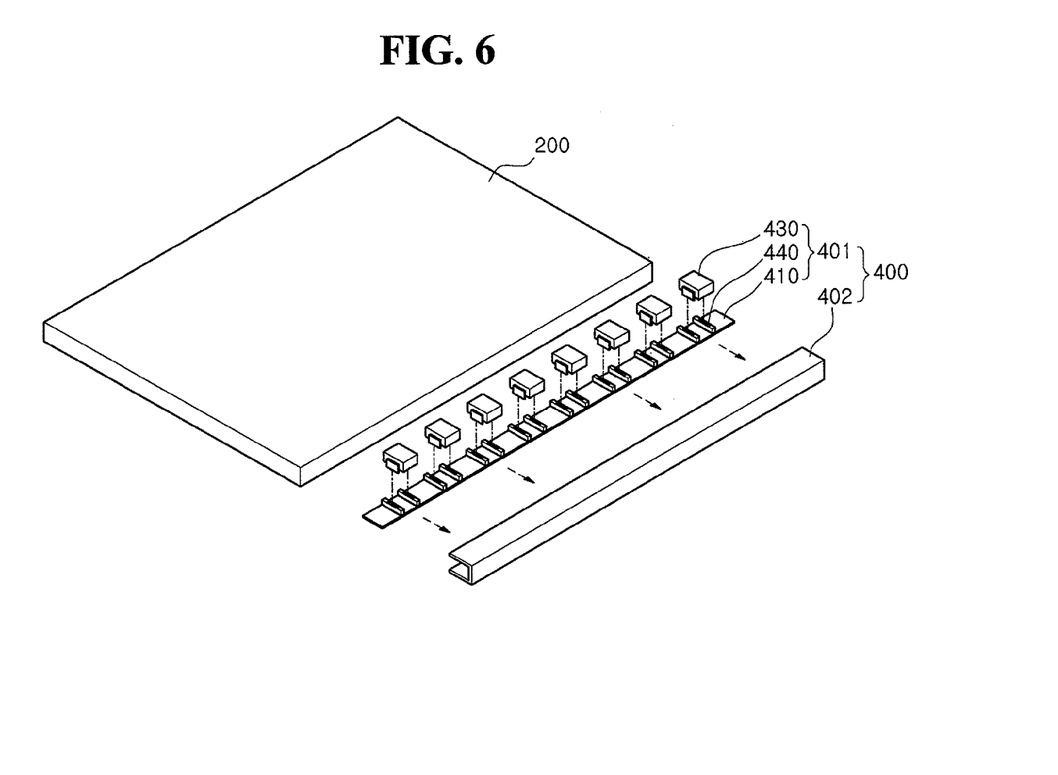
FIG. 6 is an exploded perspective view of a display device in accordance with an exemplary embodiment of the present invention.
Figure 7:
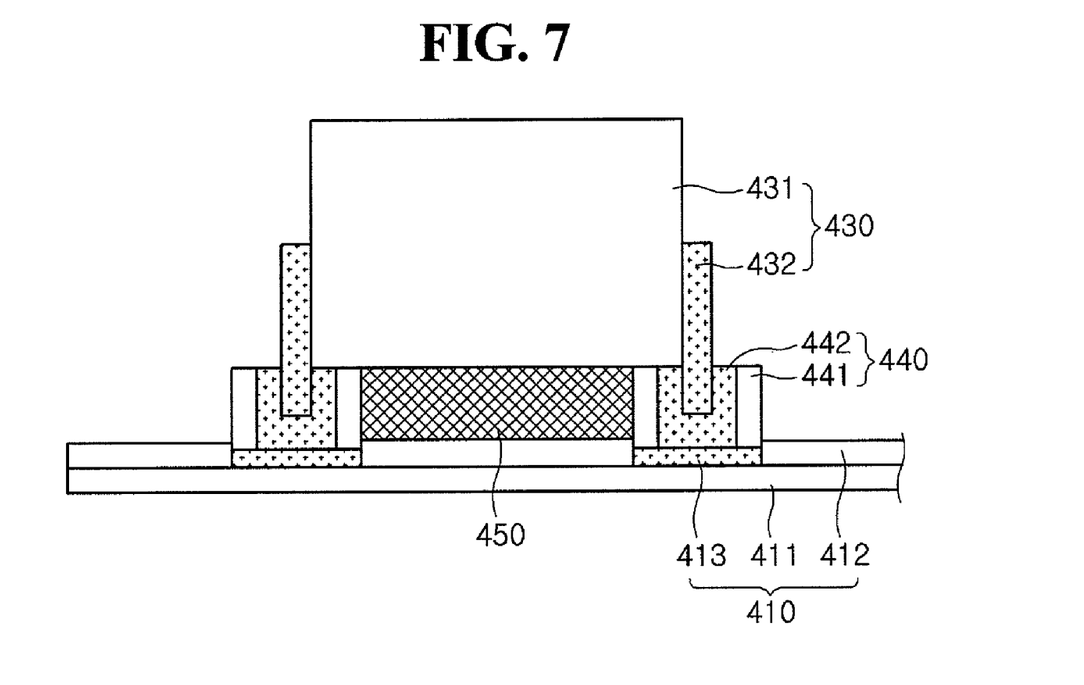
FIG. 7 is a cross-sectional view of a light source according to an exemplary embodiment of the present invention.
Figure 8:
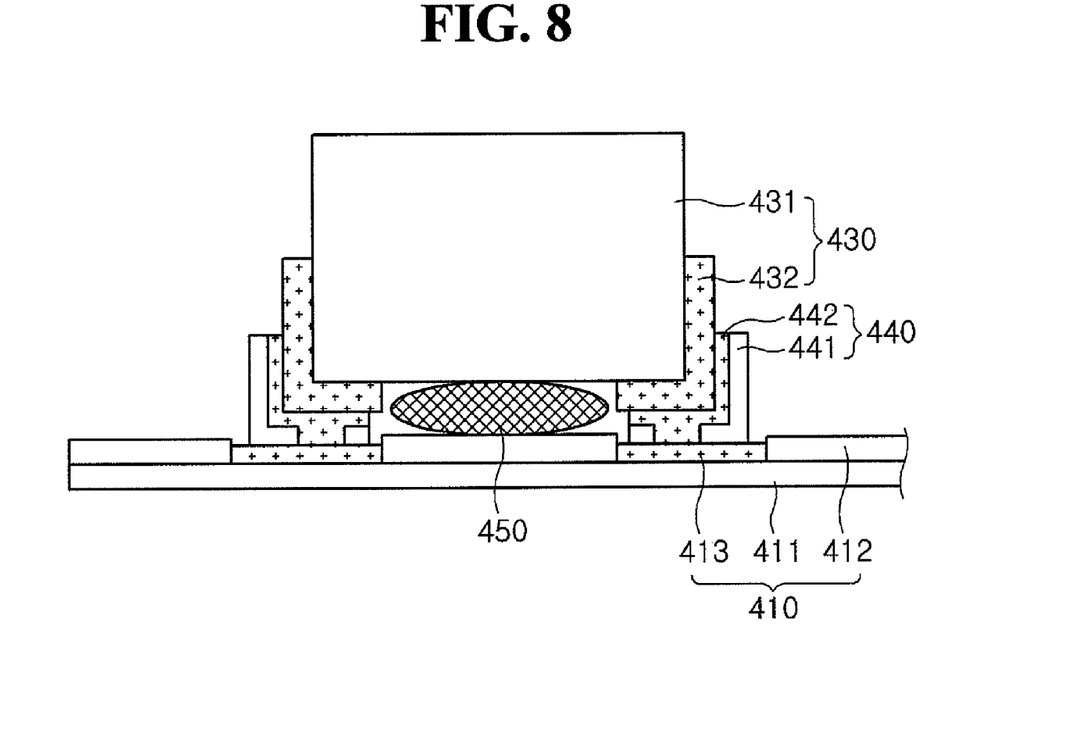
FIGS. 8 through 10 are cross-sectional views of light sources in accordance with exemplary embodiments of the present invention.
Figure 9:
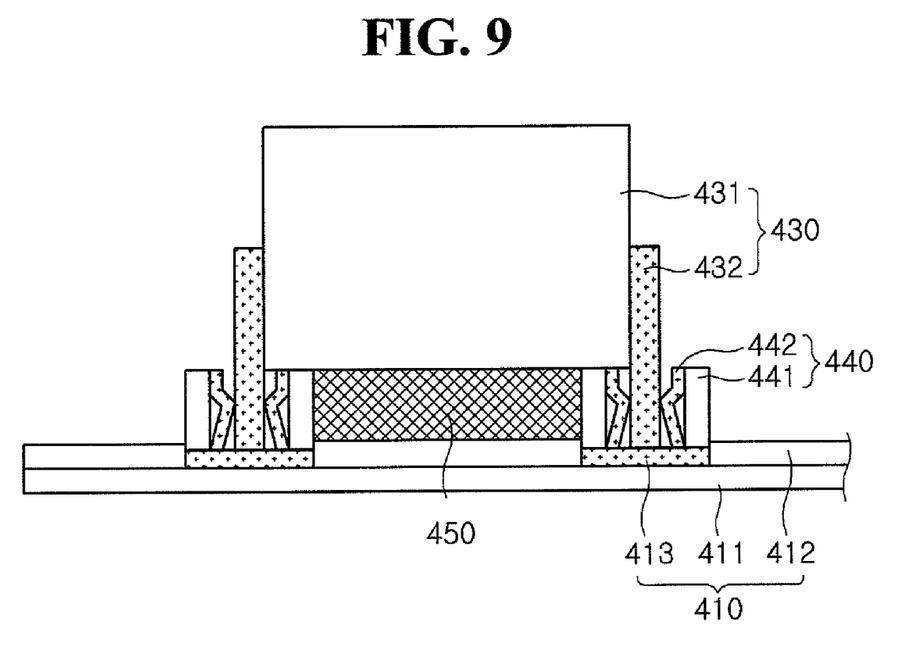
Figure 10:
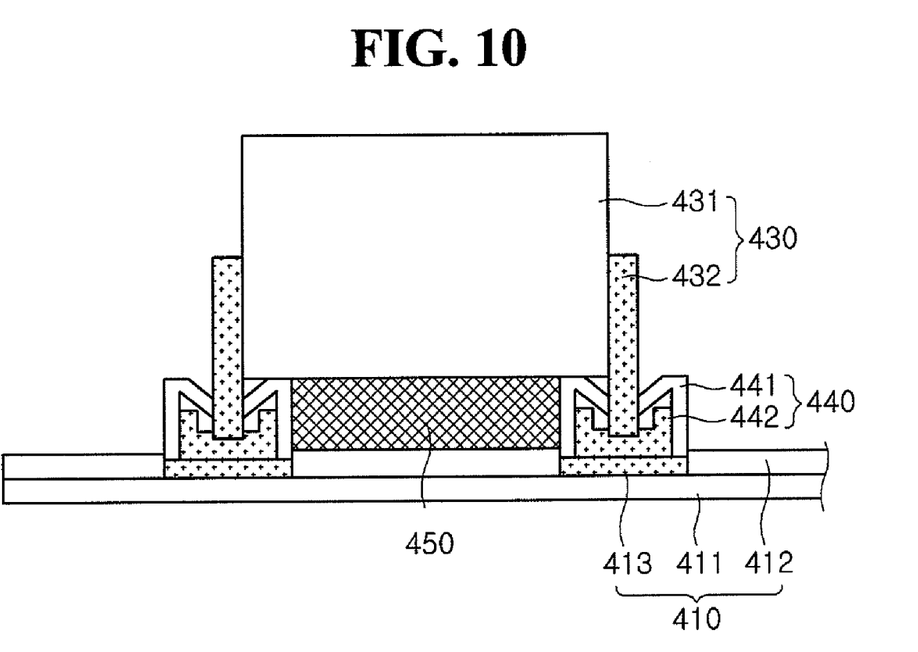

FIG. 6 is an exploded perspective view of a display device in accordance with an exemplary embodiment of the present invention. FIG. 7 is a cross-sectional view of a light source in an exemplary embodiment of the present invention. FIGS. 8 through 10 are cross-sectional views of light sources in accordance with exemplary embodiments of the present invention.

Referring to FIGS. 6 and 7, the light source module 500 includes a light guide plate 200, a light source unit 400 adjacently disposed at one side of the light guide plate 200. The light guide unit 400 includes a light source 401 and a light source cover 402.

Referring to FIG. 6, the light source 401 includes a mounting substrate 410, a plurality of sockets 440 provided on the mounting substrate 410, and a plurality of LEDs 430 coupled to the sockets 440. Referring to FIG. 7, the light source 401 includes a heat sink member 450 provided between the LED 430 and the mounting substrate 410.

The plurality of LEDs 430 are electrically connected to the metal line 413 of the mounting substrate 410 through the socket 440. Therefore, an external voltage applied through the metal line 413 can be provided to the LED 430.

Referring to FIG. 7, the mounting substrate 410 includes a base film 411, a plurality of metal lines 413 and a protective film 412. A portion of the protective film 412 is removed to expose a portion of the metal line 413 disposed thereunder. The socket 440 is positioned on the exposed metal line 413.

The socket 440 includes a connection electrode 442 and a protective case 441 configured to protect the connection electrode 442. Referring to FIGS. 6 and 7, the socket 440 is formed in a quadratic prism shape where a recess is provided in a central portion of the upper surface thereof. For example, the connection electrode 442 is formed in a cup shape having a recess. Referring to FIG. 7, the connection electrode 442 includes a bottom electrode and a sidewall electrode upwardly protruding from an edge of the bottom electrode. A portion of the connection electrode 442 is electrically connected to the exposed metal line 413 of the mounting substrate 410. That is, the bottom electrode may be electrically connected to the exposed metal line 413. The connection electrode 442 may be electrically connected to the exposed metal line 413 through a soldering using a solder.

In an exemplary embodiment, a solder may be provided to connect the connection electrode 442 and the metal line 413 to each other. The soldering for socket connection is performed before the LED 430 is mounted such that the LED 430 is not affected by heat. In an exemplary embodiment, the exposed metal line 413 may be electrically connected to the connection electrode 442 through various technologies. For example, the exposed metal line 413 and the connection electrode 442 may be electrically connected to each other using a conductive adhesive or an AFC.

The protective case 441 can surround outer sides of the connection electrode 442. As such, adjacent sockets 440 can be insulated from each other, and the socket 440 can be insulated from other surrounding components.

In an exemplary embodiment, the electrode 432 of the LED 430 protrudes from both sidewalls of the body 431, and extends along the sidewalls to protrude in a downward direction of the body 431. Therefore, the portion of the electrode 432 protruding in the downward direction of the body 431 of the LED 430 is inserted into the recess of the connection electrode 442. As such, the LED 430 is electrically connected to the connection electrode 442 of the socket 440. A size of the recess may be equal to or smaller than that of the electrode 432. Thus, the LED 430 inserted into the recess of the connection electrode 442 is not detached from the socket 440. In an exemplary embodiment, the LED 430 may be pressed down by the light source cover 402 so that the LED 430 may not be detached from the socket 440.

The heat sink member 450, which is provided between the LED 430 and the mounting substrate 410, can support the LED 430 and dissipate the heat generated from the LED 430 to the outside. The heat sink member 450 may include, for example, a heat slug, a heat sink grease or a heat sink tape.

Referring to FIG. 8, the connection electrode 442 of the socket 440 is formed in an L-shape according to an exemplary embodiment of the present invention. The electrode 432 of the LED 430 extends along portions of side and bottom surfaces of the body 431. Two sockets 440 in pair are respectively connected to an anode electrode and a cathode electrode of the LED 430. Therefore, the LED 430 can be inserted into a space between the two sockets 440, and the two sockets 440 hold the LED 430 at both sides thereof, thereby fixing the LED 430 to the sockets 440. The connection electrode 442 is connected to the electrode 432 extending along the side and bottom surfaces of the body 431 so that the connection electrode 442 is electrically connected to the electrode 432 of the LED 430. In an exemplary embodiment, the protective case 441 may extend up to a predetermined portion of the base of the connection electrode 442.

Referring to FIG. 9, a portion of the connection electrode 442 of the socket 440 may be bent according to an exemplary embodiment of the present invention. A bent shape of the connection electrode 442 can prevent the electrode 432 of the LED 430 inserted into the recess of the connection electrode 442 from being detached from the socket 440. Referring to FIG. 10, the protective case 441 of the socket 440 may be partially bent to prevent the electrode 432 of the LED 430 from being detached from the socket 440 according to an exemplary embodiment of the present invention.

In accordance with the exemplary embodiments, by using an anisotropic conductive film (ACF), an LED can be attached to a flexible PCB, and an electrode of the LED can be electrically connected to a metal line of the flexible PCB.

In accordance with exemplary embodiments, the attachment process of the LED using the ACF is performed at a relatively low temperature, thus minimizing optical property changes of the LED.

In accordance with exemplary embodiments, because a socket is attached on the metal line of the flexible PCB and the electrode of the LED is inserted into the socket, the electrode of the LED and the metal line can be electrically connected to each other.

In accordance with exemplary embodiments, the LED is mounted on a mounting substrate using a socket to minimize optical property changes of the LED, which might be caused by heat generated during the mounting process.

Although exemplary embodiments have been described with reference to the accompanying drawings, it is to be understood that the present invention is not limited to these precise embodiments but various changes and modifications can be made by one skilled in the art without departing from the spirit and scope of the present invention. All such changes and modifications are intended to be included within the scope of the invention as defined by the appended claims.

What is claimed is:

1. A light source module, comprising:
a mounting substrate including at least two metal lines;
a light-emitting diode (LED) including two electrodes corresponding to the at least two metal lines; and
an anisotropic conductive film (ACF) provided on the mounting substrate, the ACF electrically connecting the at least two metal lines to the two electrodes,
wherein the ACF comprises an insulation body, and a plurality of conductive particles dispersed in the insulation body and insulated from each other, and an insulation of the conductive particles disposed between the two metal lines and the two electrodes of the LED is prevented in at least a first direction,
wherein the first direction is perpendicular to a surface of the mounting substrate.

2. The light source module of claim 1, wherein a release film is attached on a first region of the ACF excluding a second region where the LED is positioned.

3. The light source module of claim 1, wherein the mounting substrate comprises at least one of a printed circuit board (PCB) or a flexible PCB.

4. The light source module of claim 1, wherein the insulation body comprises a thermoplastic adhesive.

5. The light source module of claim 4, wherein the conductive particle comprises at least one of a metal particle or a resin particle coated with a metal, and an insulation layer is provided on a surface of the conductive particle.

6. A light source module, comprising:
a mounting substrate including at least two metal lines;
a plurality of sockets electrically connected to the at least two metal lines; and
a light-emitting diode (LED) including a body receiving a light-emitting element and two electrodes formed on both sidewalls of the body and coupled to the plurality of sockets.

7. The light source module of claim 6, wherein the plurality of sockets are electrically connected to the at least two metal lines through at least one of a solder, a conductive adhesive or an anisotropic conductive film (ACF).

8. The light source module of claim 6, further comprising a heat sink member provided between the mounting substrate and the light-emitting (LED).

9. The light source module of claim 8, wherein the heat sink member comprises at least one of a heat slug, heat sink grease or heat sink tape.

10. The light source module of claim 6, wherein each of the plurality of sockets
comprises a connection electrode electrically connected to one of at least two metal lines and a case configured to protect and insult the connection electrode.

11. The light source module of claim 10, wherein the connection electrode includes a
recess on a upper surface thereof and the electrode of the light-emitting diode(LED) are inserted into the recess.

12. The light source module of claim 11, wherein a width of the recess is substantially equal to or less than that of the electrode to attach the light emitting diode (LED) on the mounting substrate.

13. The light source module of claim 10, wherein the case extends upwardly to a predetermined portion from a base of the connection electrode, and an end portion of the case partially bends toward the recess and contacts the electrode.

14. The light source module of claim 10, wherein the connection electrode includes a
bending portion thereof and the bending portion contacts the electrode of the light
emitting diode(LED).

15. The light source module of claim 6, wherein the plurality of sockets comprises
a first and a second sockets, facing each other and receiving a cathode and a anode of the light emitting diode (LED), respectively.

16. The light source module of claim 15, wherein connection electrodes, disposed within the first and the socket respectively, have L-shape structure and the light emitting diode (LED) are inserted into a space between the connection electrodes.

17. A display device, comprising:
a light source module comprising a mounting substrate including at least two metal lines, a light-emitting diode (LED) including two electrodes corresponding to the at least two metal lines, and an anisotropic conductive film (ACF) provided on the mounting substrate, wherein the ACF electrically connects the at least two metal lines to the two electrodes; and
a display panel displaying an image using light provided from the light source module,
wherein the ACF comprises an insulation body, and a plurality of conductive particles dispersed in the insulation body and insulated from each other, and an insulation of the conductive particles disposed between the two metal lines and the two electrodes of the LED is prevented in at least a first direction, and
wherein the first direction is perpendicular to a surface of the mounting substrate.

18. The display device of claim 17, wherein the light source module comprises a plurality of LEDs and a light guide plate disposed adjacent to the plurality of LEDs.

19. The display device of claim 17, wherein the light source module further comprises a plurality of mounting substrates where a plurality of LEDs are electrically connected to the at least two metal lines through the ACF, and the plurality of mounting substrates are uniformly disposed under the display panel.

20. A display device, comprising:
a light source module comprising a mounting substrate including at least two metal lines, a plurality of sockets electrically connected to the at least two metal lines, and a light-emitting diode (LED) including a body receiving a light-emitting element and two electrodes formed on both sidewalls of the body and coupled to the plurality of sockets; and
a display panel displaying an image using light provided from the light source module.

* * * * *